United States Patent
De et al.

(10) Patent No.: US 9,236,267 B2
(45) Date of Patent: Jan. 12, 2016

(54) CUT-MASK PATTERNING PROCESS FOR FIN-LIKE FIELD EFFECT TRANSISTOR (FINFET) DEVICE

(75) Inventors: Ho Wei De, Hsinchu (TW); Kuei-Liang Lu, Hsinchu (TW); Ming-Feng Shieh, Yongkang (TW); Ching-Yu Chang, Yilang County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 875 days.

(21) Appl. No.: 13/369,818

(22) Filed: Feb. 9, 2012

(65) Prior Publication Data

US 2013/0210232 A1    Aug. 15, 2013

(51) Int. Cl.
*H01L 21/308* (2006.01)
*H01L 21/84* (2006.01)
*H01L 27/12* (2006.01)

(52) U.S. Cl.
CPC ........ *H01L 21/3086* (2013.01); *H01L 21/3088* (2013.01); *H01L 21/845* (2013.01); *H01L 27/1211* (2013.01)

(58) Field of Classification Search
CPC .............. H01L 21/845; H01L 21/3086; H01L 21/3088; H01L 27/1211
See application file for complete search history.

(56) References Cited

U.S. PATENT DOCUMENTS

| | | | |
|---|---|---|---|
| 8,486,770 B1 | 7/2013 | Wu et al. | |
| 2006/0121715 A1* | 6/2006 | Chang et al. | 438/599 |
| 2009/0253238 A1* | 10/2009 | Shi et al. | 438/279 |
| 2011/0058410 A1* | 3/2011 | Osabe | 365/163 |
| 2012/0118854 A1* | 5/2012 | Smayling et al. | 216/37 |
| 2013/0318485 A1* | 11/2013 | Park et al. | 716/102 |
| 2015/0014772 A1* | 1/2015 | Cheng et al. | 257/347 |

OTHER PUBLICATIONS

Ming-Feng Shieh et al., Unpublished U.S. Appl. No. 13/339,646, filed Dec. 29, 2011 entitled "Mandrell Modification for Achieving Single Fin Fin-Like Field Effect Transistor (FinFET) Device", 53 pages.

Cheng-Hsien Wu et al., Unpublished U.S. Appl. No. 13/340,837, filed Dec. 30, 2011, entitled A CMOS FinFET Device and Method of Forming the Same, 72 pages.

Ho Wei De et al., Unpublished U.S. Appl. No. 13/368,144, filed Feb. 7, 2012, entitled "Patterning Process for Fin-Like Field Effect Transistor (FinFET) Device," 38 pages.

* cited by examiner

*Primary Examiner* — Bac Au
*Assistant Examiner* — Toniae Thomas
(74) *Attorney, Agent, or Firm* — Haynes and Boone, LLP

(57) ABSTRACT

A method for patterning a plurality of features in a non-rectangular pattern, such as on an integrated circuit device, includes providing a substrate including a surface with a plurality of elongated protrusions, the elongated protrusions extending in a first direction. A first layer is formed above the surface and above the plurality of elongated protrusions, and patterned with an end cutting mask. The end cutting mask includes two nearly-adjacent patterns with a sub-resolution feature positioned and configured such that when the resulting pattern on the first layer includes the two nearly adjacent patterns and a connection there between. The method further includes cutting ends of the elongated protrusions using the pattern on the first layer.

20 Claims, 13 Drawing Sheets

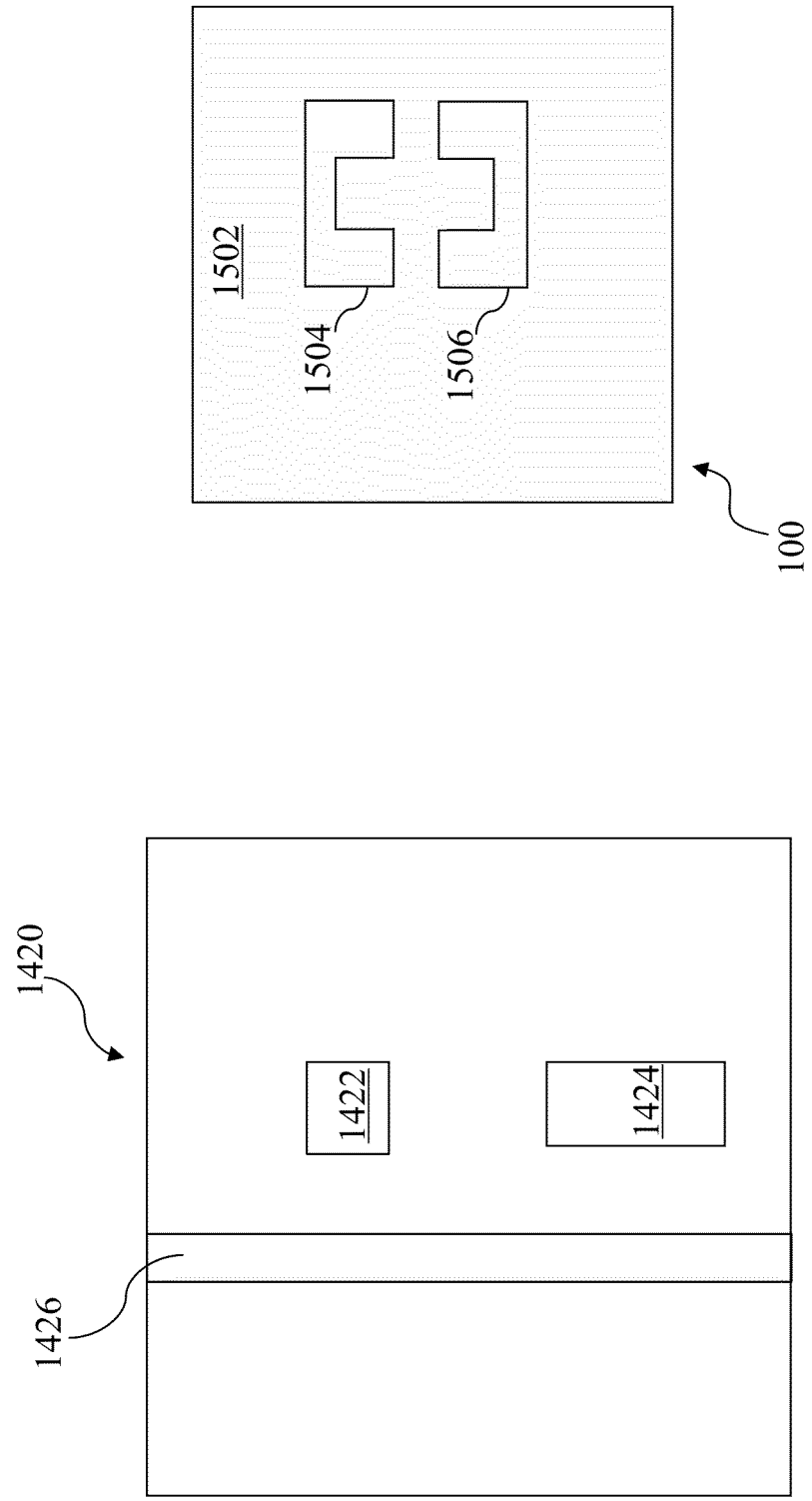

CUT-MASK PATTERNING PROCESS FOR FIN-LIKE FIELD EFFECT TRANSISTOR (FINFET) DEVICE

BACKGROUND

Integrated circuit (IC) technologies are constantly being improved. Such improvements frequently involve scaling down device geometries to achieve lower fabrication costs, higher device integration density, higher speeds, and better performance. Lithography is frequently used for forming components of an integrated circuit device, where generally, an exposure tool passes light through a mask or reticle and focuses the light onto a resist layer of a wafer, resulting in the resist layer having an image of integrated circuit components therein. Forming device patterns with smaller dimensions is limited by a resolution of the exposure tool. For example, forming fin-like field effect (FinFET) devices is limited by current lithography resolution limits. Accordingly, although existing lithography techniques have been generally adequate for their intended purposes, as device scaling down continues, they have not been entirely satisfactory in all respects.

SUMMARY

The present disclosure describes integrated circuit devices, processing methods, and masks for use in semiconductor processing. In one embodiment, a method for patterning a plurality of features on an integrated circuit device includes providing a substrate including a surface with a plurality of elongated protrusions, the elongated protrusions extending in a first direction. A first layer is formed above the surface and above the plurality of elongated protrusions, and patterned with an end cutting mask. The end cutting mask includes two nearly-adjacent patterns with a sub-resolution feature positioned and configured such that when the resulting pattern on the first layer includes the two nearly adjacent patterns and a connection there between. The method further includes cutting ends of the elongated protrusions using the pattern on the first layer.

In another embodiment, the method includes providing a substrate including a surface with a first layer and a second layer and forming first, second, and third elongated protrusions in a third layer above the first and second layers. A first patterned layer is formed over the three elongated protrusions and the plurality of elongated protrusions are etched to form a first pattern of the three elongated protrusions. Etching the first pattern removes a relatively larger portion of the second elongated protrusion, and relatively smaller portions of the first and third elongated protrusions, whereby an area is formed by the larger and smaller portions. The method further includes forming a second patterned layer over the first pattern of elongated protrusions. The second pattern includes at least two separate rectangular sub-patterns over the area. The ends of the first and third elongated protrusions that extend in the area are then etched.

The present disclosure also describes a unique mask set. In one embodiment, the mask set includes a first mask. The first mask includes first and second pattern areas that are greater than a defined resolution of a lithography system in which the mask set will be used. Portions of the first and second pattern areas are positioned proximate to each other in an intersection area. The first mask also includes a sub-resolution feature between the first and second pattern areas and in the intersection area. The combination of the sub-resolution feature and a size of the intersection area are such that when the mask is used in the lithography system, a resulting pattern includes the first and second pattern areas interconnected with each other through the intersection area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

FIGS. 1A-1C are top views, FIG. 1D is a side view of the integrated circuit device of FIG. 1C.

FIGS. 2, 5, 8-9, and 14 are top views of masks used for further processing the device of FIG. 1 according to one or more embodiments of the present invention.

FIGS. 3A-4 are top and cross-sectional views of the integrated circuit device of FIG. 1 being processed using the masks of FIG. 2, according to one or more embodiments of the present invention.

FIG. 15 is a top view of an integrated circuit device according to one or more embodiments of the present invention.

DETAILED DESCRIPTION

Figure 1A:
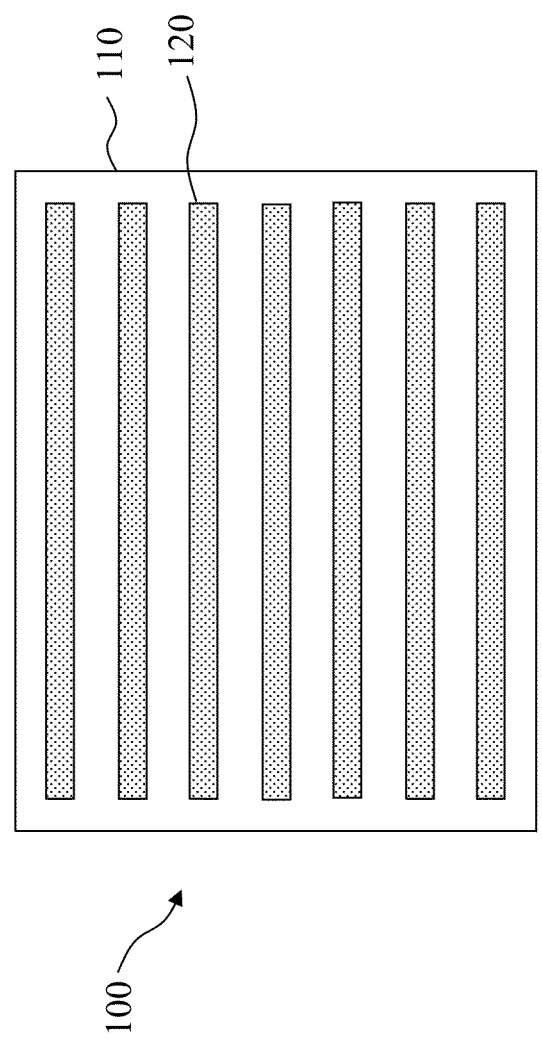
FIGS. 1A-1D are views of an integrated circuit device on which a plurality of spacers are formed.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, the present disclosure repeats various processes (such as patterning). The process will be described in greater detail and with a list of alternative embodiments the first time it is discussed. Thereafter, the process will be described in more general detail to avoid unnecessary repetition. It is understood, however, that such detail and alternative embodiments may also be applied to the later-discussed processes.

The present disclosure is directed to an integrated circuit device during various stages of fabrication. The integrated circuit device is an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. In some of the depicted embodiments, as further discussed below, the integrated circuit device includes various FinFET devices, and the integrated circuit device is illustrated during various stages of FinFET device fabrication. The term FinFET device refers to any fin-based, multi-gate transistor. Additional features can be added in the integrated circuit device, and some of the features described below can be replaced or eliminated in other embodiments of the integrated circuit device.

Referring to FIGS. 1A-1D, a first or main masking process is performed to define a width and a pitch of fins of various fin structures of the integrated circuit device 100, where the fin structures are included in various FinFET devices. In FIG. 1A, a substrate 110 is provided. In the present example, the substrate 110 is a semiconductor substrate including a stack of silicon (Si) and silicon dioxide (SiO2). Alternatively or additionally, the substrate 110 includes an elementary semiconductor, such as silicon or germanium; a compound semiconductor, such as silicon carbide, gallium arsenide, gallium phosphide, indium phosphide, indium arsenide, and/or indium antimonide; or combinations thereof. Alternatively, the substrate 110 is a silicon-on-insulator (SOI) substrate, which can be fabricated using separation by implantation of oxygen (SIMOX), wafer bonding, or other methods. The substrate 110 may include various doped regions and other suitable features.

An array of mandrels 120 are disposed over the substrate 110, where adjacent mandrels 120 are spaced from one another. The mandrels 120 include a patterning or masking material, such as a resist material, polysilicon, silicon oxide, silicon nitride, other patterning or masking material, or combinations thereof. In an example, forming the mandrels 120 includes depositing a patterning or masking layer (such as a polysilicon layer) over the substrate 110; forming a resist layer over the masking layer; using a mandrel mask (which may be referred to as a main mask) to expose the resist layer to radiation, thereby forming exposed portions of the resist layer and unexposed portions of the resist layer; removing the exposed portions or unexposed portions of the resist layer (for example, by subjecting the exposed resist layer to a developing solution), thereby forming a patterned resist layer that exposes portions of the masking layer; and using the patterned resist layer to etch the masking layer, specifically, the exposed portions of the masking layer, to form the mandrels 120 as illustrated in FIG. 1A. In other examples, the mandrels 120 are formed by various deposition processes, lithography processes, etching processes, or combinations thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other deposition methods, or combinations thereof. The lithography processes may include resist coating (for example, spin-on coating), soft baking, mask aligning, exposure, post-exposure baking, developing the resist, rinsing, drying (for example, hard baking), other lithography process, or combinations thereof. Alternatively, the lithography processes can be implemented or replaced by other methods, such as maskless lithography, electron-beam writing, ion-beam writing, and/or nanoimprint technology. The etching processes include dry etching, wet etching, other etching methods, or combinations thereof.

Figure 1B:
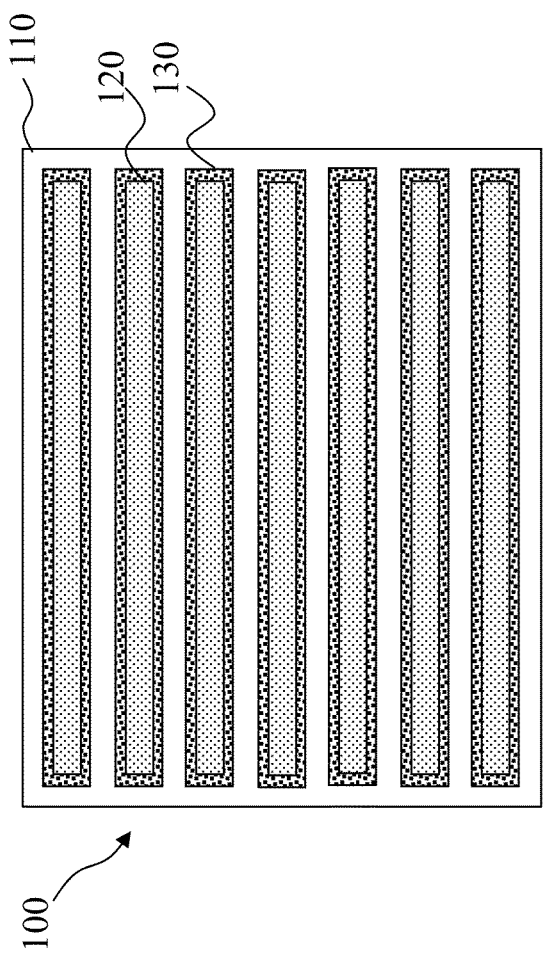
Figure 1C:
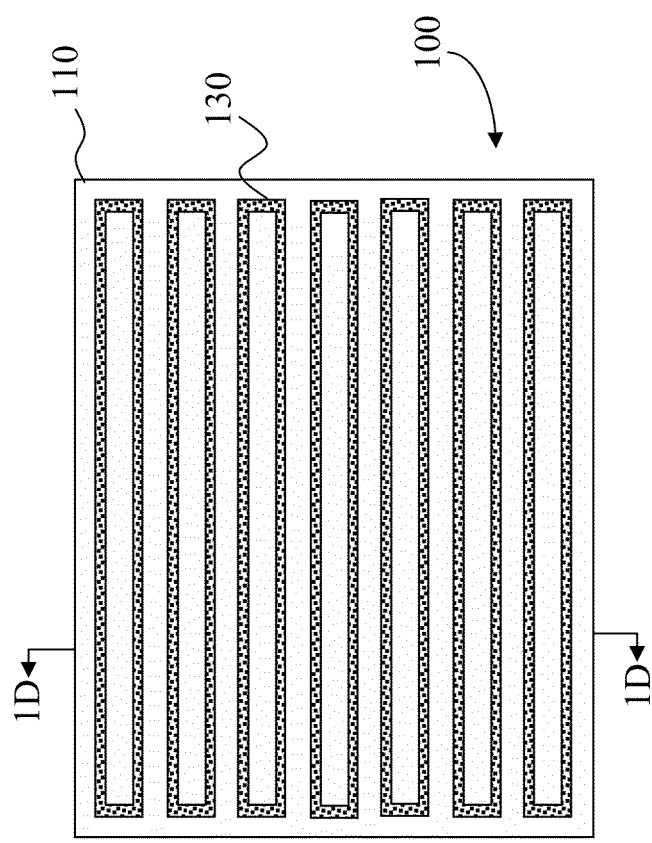

In FIG. 1B, spacers 130 are formed over the substrate 110, such that each of the mandrels 120 is surrounded by a spacer 130; and in FIG. 1C, the mandrels 120 are removed, for example, by an etching process, such that the spacers 130 remain disposed over the substrate 110. The spacers 130 include a patterning or masking material, which in the present embodiment is silicon nitride (SiN). Other examples include a resist material, polysilicon, silicon oxide, other patterning or masking material, or combinations thereof. The spacers 130 are formed by various deposition processes, lithography processes, etching processes, or combinations thereof, such as the processes described herein. The spacers 130 on opposite sidewalls of each mandrel 120 have a width that is less than the width of each mandrel 120. The spacers on opposite sidewalls of each mandrel 120 are also spaced from one another by a pitch that is less than the pitch of the mandrels 120. As further described below, the spacers 130 are used to form the fin structures of the integrated circuit device 100, and are hereinafter referred to as fins 130.

Figure 1D:
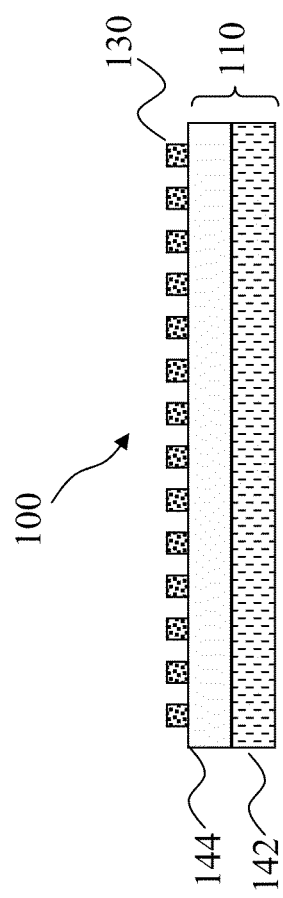

It is desired to pattern the group of fins 130 shown in FIGS. 1C and 1D to a predetermined non-rectangular pattern. As will be discussed further below, difficulties often arise in shaping the fins 130, especially end-cutting the fins so that the ends of the fins are uniformly aligned and do not include corner rounding, especially around inside corners of the non-rectangular pattern.

Figure 2:
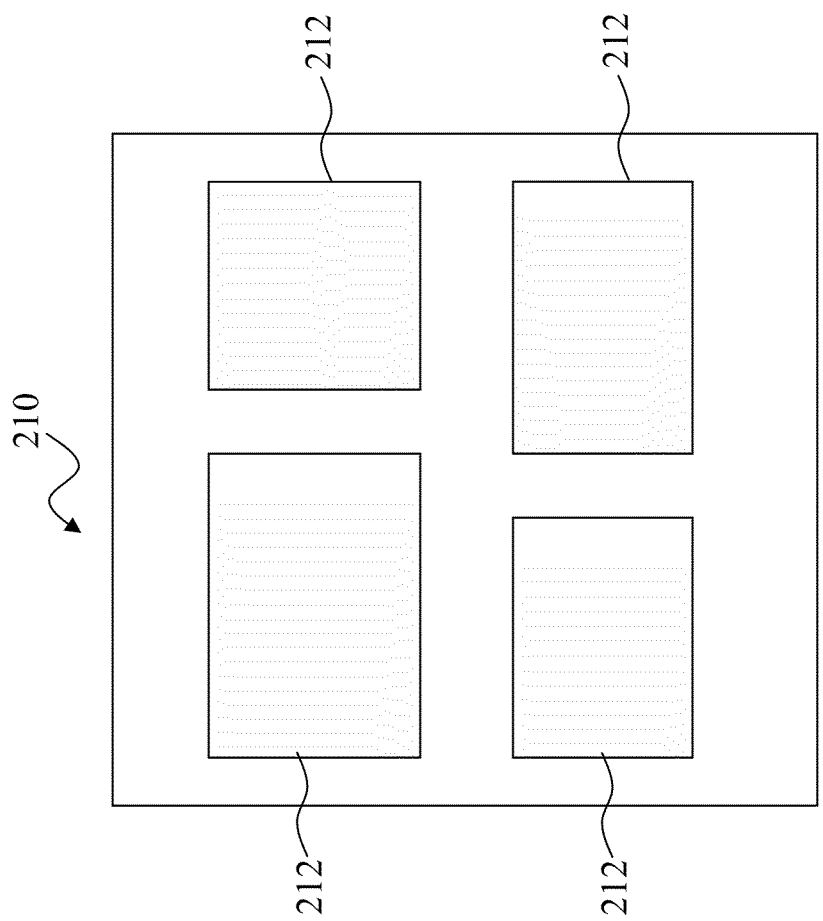

Referring now to FIG. 2, a mask 210 will be used in the present embodiment to remove some or all of the fins 130 (line cutting) to form a non-rectangular pattern. It is understood that the mask can be modified according to general understandings of lithography and mask making, as is well known in the art. For example, the present examples will implement a positive photoresist, in that clear tones on the mask are used to expose corresponding patterns on the photoresist. Of course, negative photoresist can also be used, in that dark tones on the mask are used to expose corresponding patterns on the photoresist. Also, known techniques such as optical proximity correction can be used, as is well known in the art. Furthermore, the lithography processes discussed below can be of various types and include multiple steps, such as those discussed above with reference to FIGS. 1A-1C.

The mask 210 can be formed in various technologies. For example, the mask may be formed using a binary technology. The binary mask includes a transparent substrate (for example, fused quartz) and an opaque material (for example, chromium) coated in the opaque regions of the mask. In another example, the masks are formed using a phase shift technology, where various features in the pattern formed on the masks are configured to have proper phase difference to enhance the resolution and imaging quality. In various examples, the phase shift mask (PSM) can be an attenuated PSM or alternating PSM.

The mask 210 is used for line cutting, and provides the non-rectangular pattern 212 that is desired in the present embodiment. The non-rectangular pattern 212 is shown to be a dark tone, while a surrounding area is shown to be a clear tone. The non-rectangular pattern 212 will be used to form a corresponding pattern of the fins 130 on the device 100.

Figure 3:
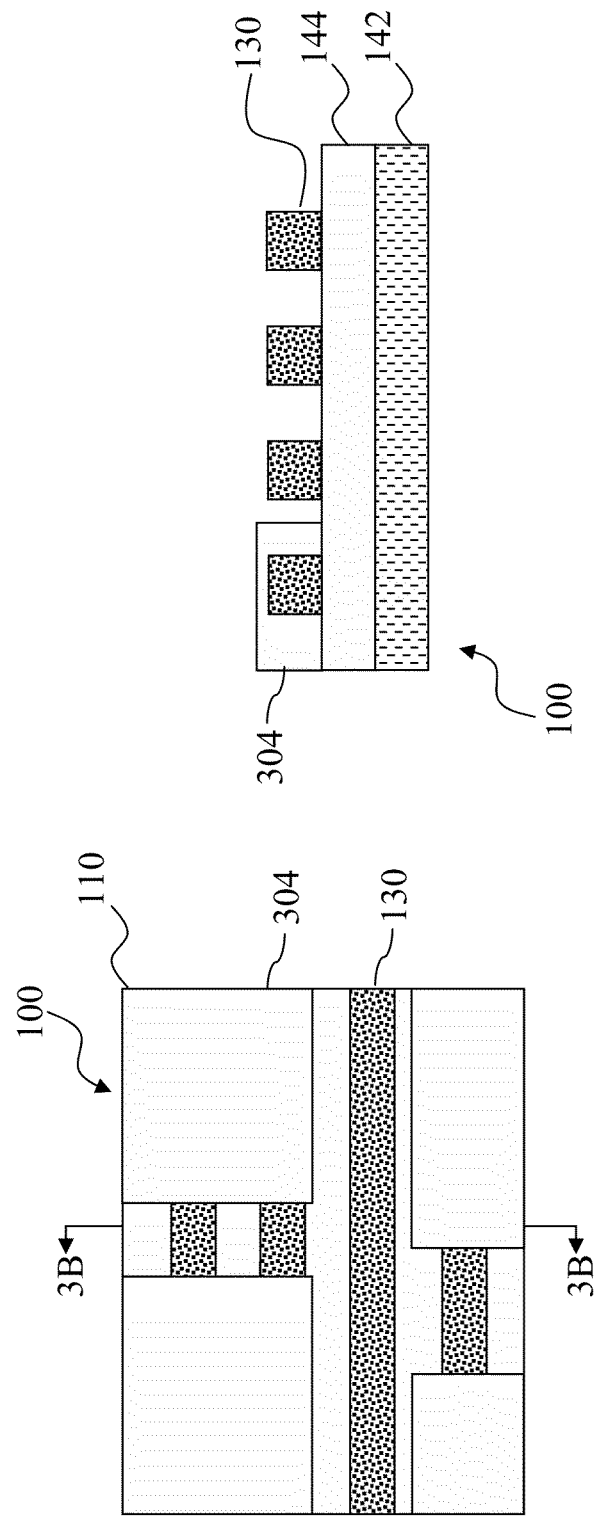
Figure 4:
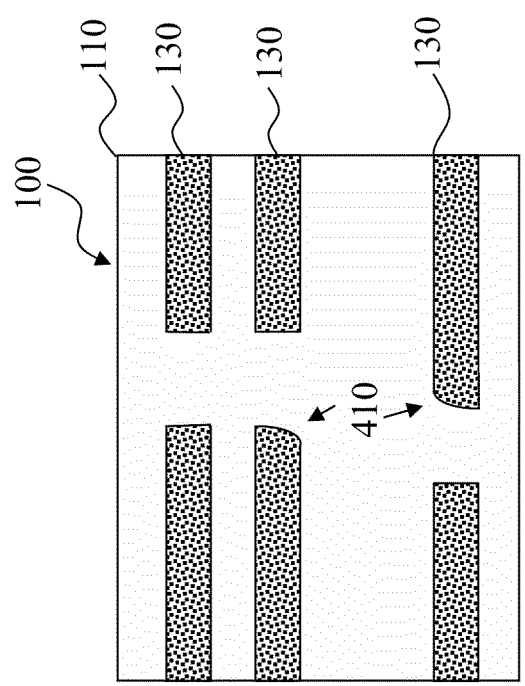

Referring to FIGS. 3A, 3B, and 4, in the present embodiment, a layer of photoresist is applied to the device 100 above the SiN fins 130 and above the substrate 110, which includes layers of Si 142 and SiO2 144. The mask 210 is used in a lithography process to form a non-rectangular photoresist pattern 304 on the device. The non-rectangular pattern corresponds to the pattern 212 of the mask 210 (FIG. 2). A SiN-selective etch process (not selective to SiO2) is then performed to remove the portions of the SiN fins 130 to produce the non-rectangular fin pattern as shown in FIG. 4. Some example etchants are CF4 or SF6. Afterwards, the non-rectangular photoresist pattern 304 is removed. As shown in FIG. 4, ends 410 of the fins 130 are ragged, in that they are neither the correct length, nor uniform. It is also noted that the inside corners of the pattern 304, as shown in FIG. 4, are curved. This is due, at least in part, to lithography resolution limits, especially around pattern corners.

Figure 5:
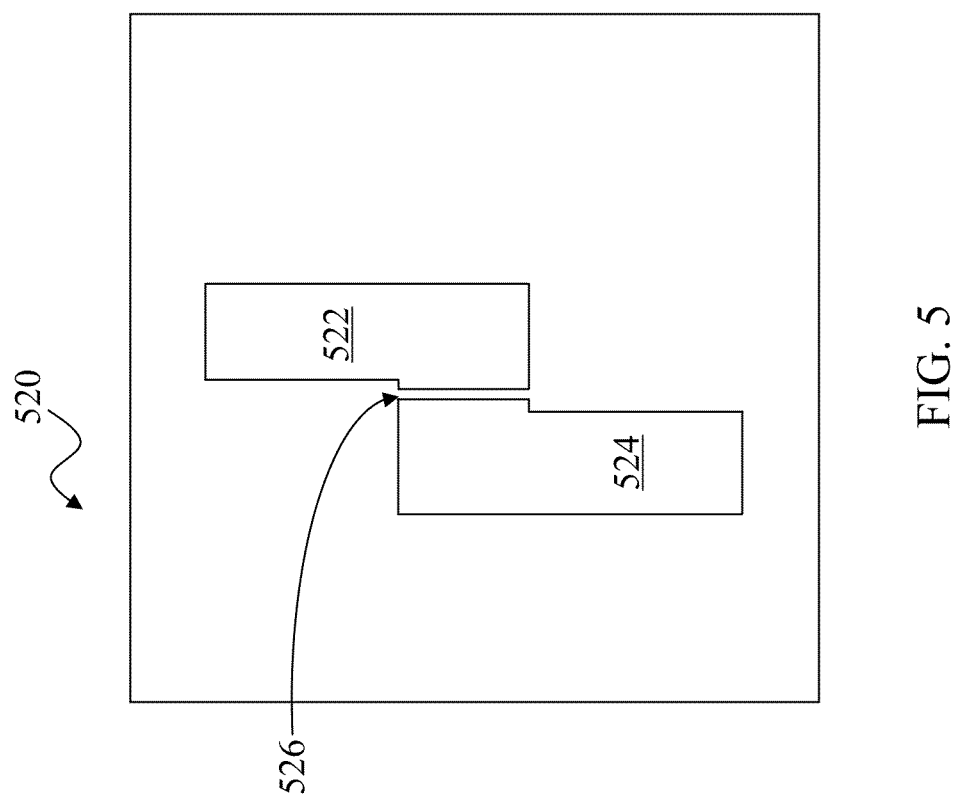

Referring now to FIG. 5, a mask 520 will be used in the present embodiment to cut the ends of the fins 130 into the non-rectangular pattern. The mask 520 can be use after the mask 210 (FIG. 2) has been used for line cutting, or the mask 520 can be used alone to perform both line cutting and end cutting. It is understood that the mask can be modified according to general understandings of lithography and mask making, as is well known in the art, such as discussed above with reference to FIG. 2. Also, the mask 520 can be formed in various technologies, as also discussed above with reference to FIG. 2. The mask 210 is used for end cutting, and provides a non-rectangular pattern that is desired in the present embodiment.

The mask 520 includes two rectangular patterns 522 and 524 that are very close to each other at an intersection area, as shown. In the intersection area between the two patterns 522, 524 is a sub-resolution feature 526. The sub-resolution feature 526 has properties, such as size or shape that would normally be considered outside of the resolution limits of a corresponding lithography process. In the present embodiment, the sub-resolution feature 526 is of a type that is often used for optical proximity correction (OPC), similar to scattering bars which are well known in the art. By being placed in the intersection area adjacent to the two patterns 522, 524, the sub-resolution feature 526 introduces counter proximity effects, sometimes referred to as an isolated/dense proximity effect. As will be discussed in greater detail below, the use of the sub-resolution feature 526 produces unique effects on the resulting pattern formed on the device.

Figure 6:
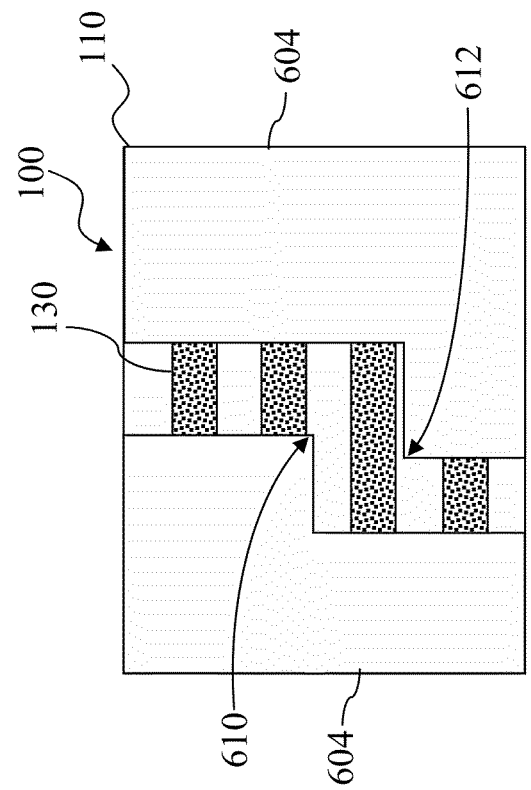
FIGS. 6-7 are top views of the integrated circuit device of FIG. 1 being processed using the masks of FIG. 5, according to one or more embodiments of the present invention.
Figure 7:
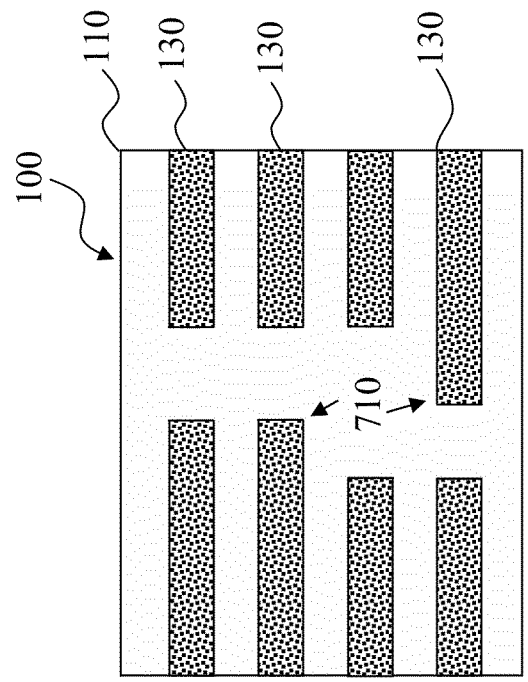

Referring to FIGS. 6-7, in the present embodiment, a layer of photoresist is applied to the device 100 above the SiN fins 130 and above the substrate 110, which includes layers of Si 142 and SiO2 144. The mask 520 is used in a lithography process to form a non-rectangular photoresist pattern 604 on the device. The non-rectangular pattern corresponds to the patterns of the mask 520 (FIG. 5). The patterns 522 and 524 are connected by the presence of the sub-resolution feature 526 on the mask 520. The sub-resolution feature 526 will not result in a patterned line on the substrate after exposure because it is an assist pattern. Without the sub-resolution feature 526, there will be corner rounding, as in the ends 410 discussed above (FIG. 4). With the sub-resolution feature 526, the corner rounding will be reduced. A SiN-selective etch process (not selective to SiO2) is then performed to remove the portions of the SiN fins 130 outside of the non-rectangular pattern to produce the non-rectangular fin pattern as shown in FIG. 7. Afterwards, the non-rectangular photoresist pattern 604 is removed. As shown in FIG. 7, ends 710 of the fins 130 are not as ragged as those in FIG. 4, but instead are relatively uniform. It is also noted that the inside corners of the pattern, as shown in FIG. 7, are not as curved as those in FIG. 4. This is due, at least in part, to the sub-resolution feature 526.

Figure 9:
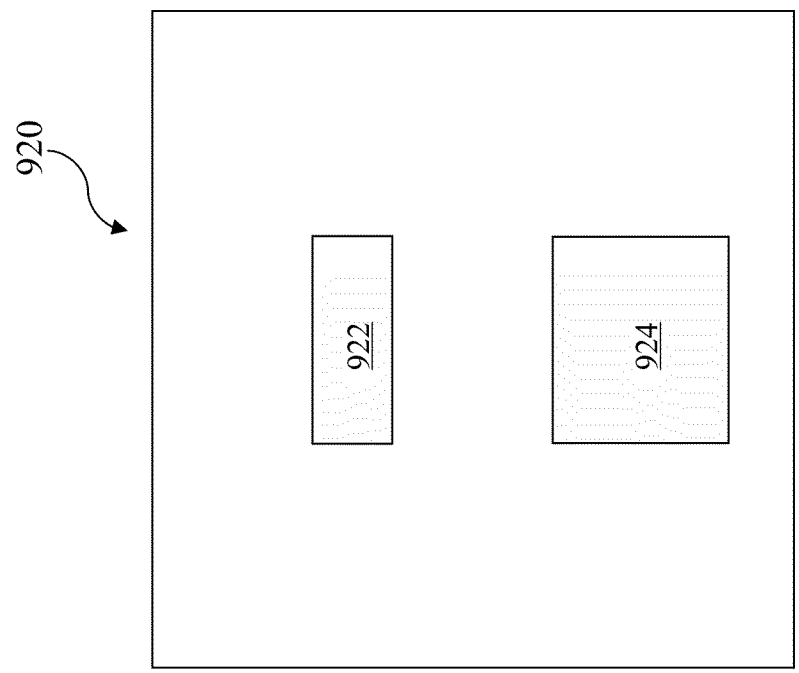
Figure 8:
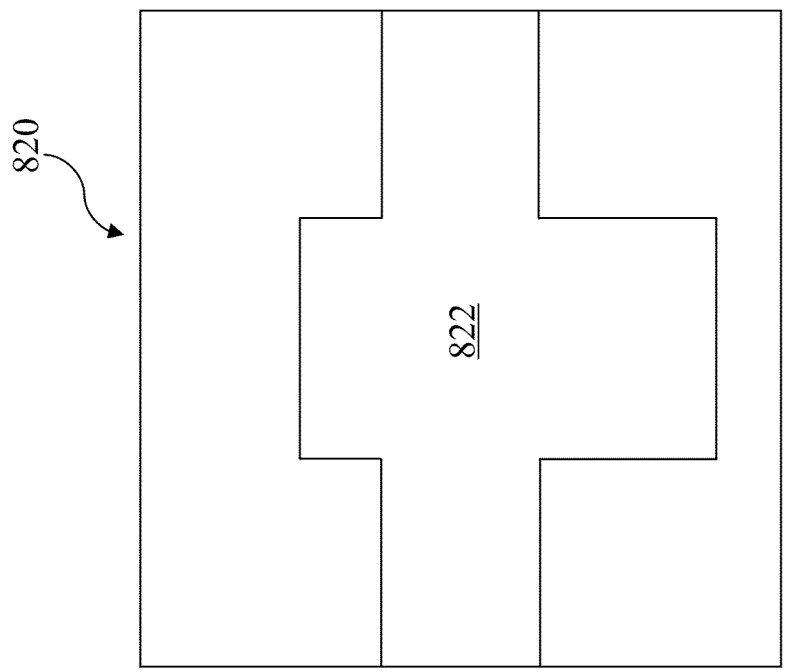

Referring now to FIGS. 8 and 9, in another embodiment, a mask 820 will be used for removing some or all of the fins 130 of FIG. 1D (line cutting) and a mask 920 will be used for further cutting the ends of the remaining fins to form a non-rectangular pattern. It is understood that the masks 820, 920 can be modified according to general understandings of lithography and mask making, as is well known in the art, such as discussed above with reference to FIG. 2. Also, the masks 820, 920 can be formed in various technologies, as also discussed above with reference to FIG. 2. The masks 820, 920 provide a non-rectangular pattern that is desired in the present embodiment. The mask 820 includes a non-rectangular pattern 822 and the mask 920 includes two rectangular patterns 922 and 924.

Figure 11:
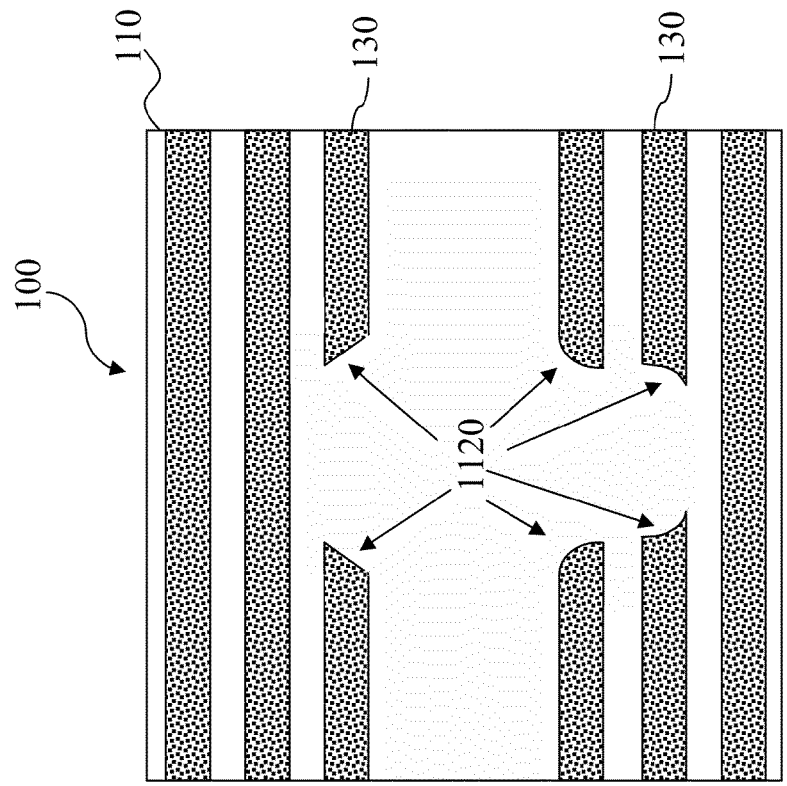
FIGS. 10-13 are top views of the integrated circuit device of FIG. 1 being processed using the masks of FIGS. 8-9, according to one or more embodiments of the present invention.
Figure 10:
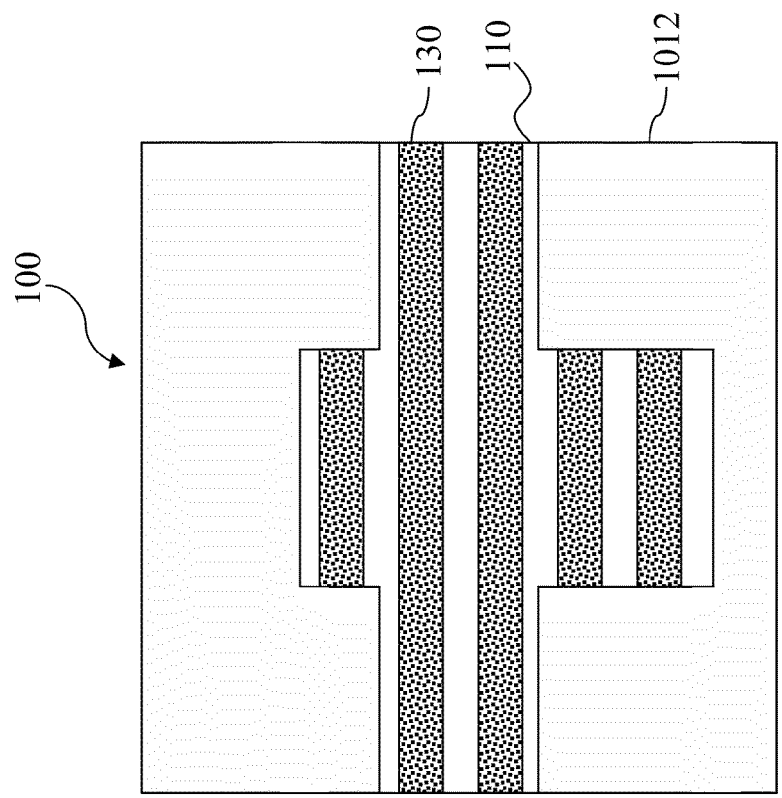

Referring to FIGS. 10 and 11, in the present embodiment, a layer of photoresist is applied to the device 100 above the SiN fins 130 and above the substrate 110. The mask 820 is used in a lithography process to form a non-rectangular photoresist pattern 1012 on the device 100. The non-rectangular pattern corresponds to the patterns of the mask 820 (FIG. 8). A SiN-selective etch process (not selective to SiO2) is then performed to remove the portions of the SiN fins 130 outside of the non-rectangular pattern to produce the non-rectangular fin pattern as shown in FIG. 11. Afterwards, the non-rectangular photoresist pattern 604 is removed. As shown in FIG. 11, some of the fins 130 are removed. Some of the remaining fins have ends 1120 that are curved around corners.

Figure 13:
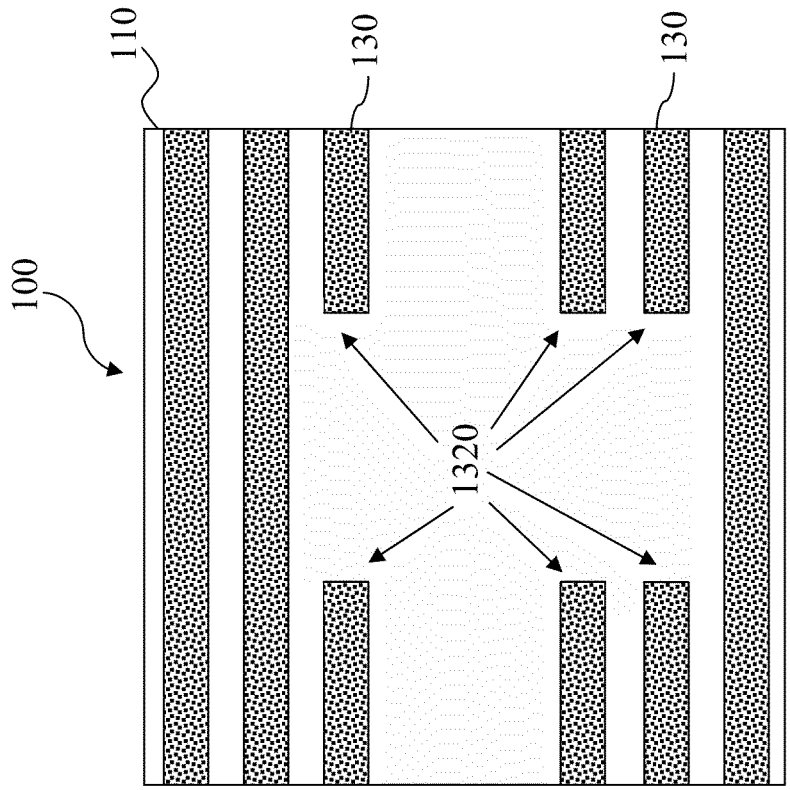
Figure 12:
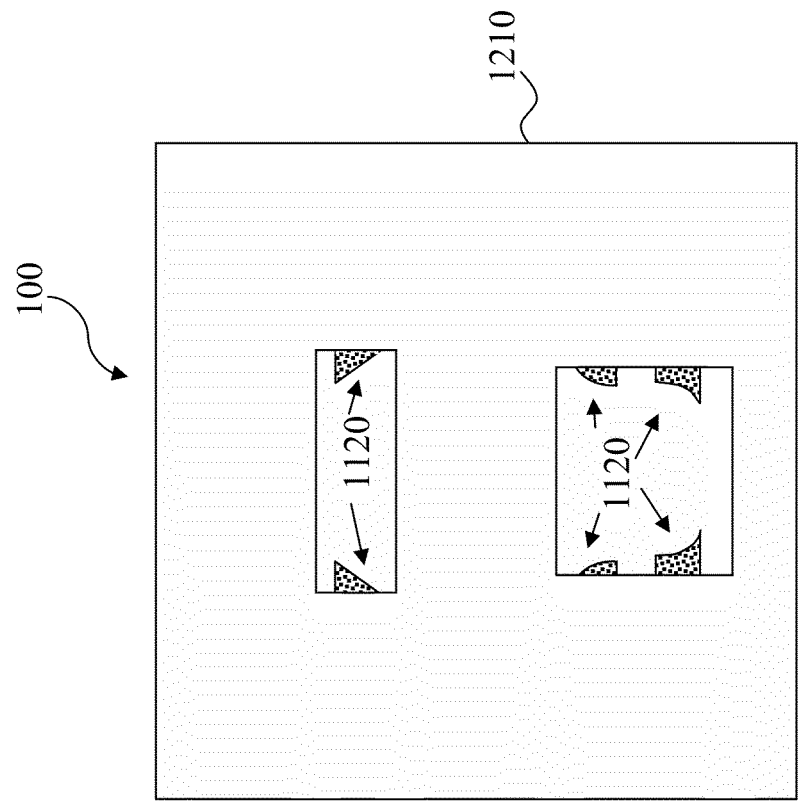

Referring to FIGS. 12 and 13, next, a second layer of photoresist is applied to the device 100 above the remaining SiN fins 130. The mask 920 is used in a lithography process to form a non-rectangular photoresist pattern 1210 on the device 100. The non-rectangular pattern corresponds to the patterns of the mask 920 (FIG. 9). A SiN-selective etch process (not selective to SiO2) is then performed to cut the SiN fins 130 outside of the non-rectangular pattern to produce the non-rectangular fin pattern as shown in FIG. 13. Afterwards, the non-rectangular photoresist pattern 604 is removed. As shown in FIG. 11, ends 1320 of the fins 130 are not as ragged as those in FIG. 11, but instead are relatively uniform. It is also noted that the inside corners of the pattern, as shown in FIG. 13, are not as curved as those in FIG. 11.

There are several additional alternative embodiments to those discussed above. Referring to FIG. 14, a mask 1420 can be used in place of the mask 920 (FIG. 9) for cutting the ends of the remaining fins 130 to form a non-rectangular pattern. The mask 1420 includes patterns 1422 and 1424 that correspond with the right side (as shown in FIG. 9) of the patterns 922, 924, respectively. However, a single line cutting pattern 1426 is provided to correspond with the left side (as shown in FIG. 9) of the patterns 922, 924. It is understood that the mask 1420 can be modified according to general understandings of lithography and mask making, as is well known in the art, as discussed above with reference to FIG. 2.

In another embodiments, an E-beam patterning device can be used in place of the mask 920 (FIG. 9) for cutting the ends of the remaining fins 130 to form a non-rectangular pattern. E-beam patterning can improve on the ragged and rounded line ends, albeit at a slightly reduced throughput.

In other embodiments, a hardmask process can be used to form the patterns discussed above. For example, a first layer of amorphous silicon can be formed over the device, including the fins, and then a photoresist layer is deposited thereon. The photoresist layer is patterned as discussed above, and then the underlying amorphous silicon layer is patterned to form the hardmask. Patterning of the underlying layers continues as above, using the patterned hardmask.

In still other embodiments, the above described masks and methods can be used for making other features besides fins, such as a pattern of trenches.

Referring now to FIG. 15, illustrated is the device 100 with a circuit area 1502 that includes a plurality of non-rectangular areas 1504 and 1506. In the embodiment of the device 100, the non-rectangular area 1504 may include n-type FinFETs and the non-rectangular area 1506 may include p-type Fin-FETs. It is understood that although the non-rectangular areas 1504, 1506 are shown as U-shaped, other non-rectangular shapes may also be used, including L-shapes, E-shapes, and so forth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for patterning a plurality of features in a non-rectangular pattern, the method comprising: providing a substrate including a surface with a plurality of elongated protrusions, the elongated protrusions extending in a first direction; forming a first layer above the surface and above the plurality of elongated protrusions; patterning the first layer with an end cutting mask, the end cutting mask including two nearly-adjacent patterns with a sub-resolution feature positioned and configured such that when the resulting pattern on the first layer includes the two nearly-adjacent patterns and a portion corresponding to the sub-resolution feature there between; and cutting ends of the elongated protrusions using the pattern on the first layer.

2. The method of claim 1 wherein the first layer is a hardmask layer.

3. The method of claim 1 wherein the first layer is a photoresist layer.

4. The method of claim 1 wherein the plurality of features are fins for fin-like field effect transistor (FinFET) devices.

5. The method of claim 4 wherein the elongated protrusions are silicon nitride spacers.

6. The method of claim 1 wherein the plurality of features are trenches.

7. The method of claim 1 further comprising:
before forming the first layer, forming a second layer above the surface and above the plurality of elongated protrusions;
patterning the second layer with a line cutting mask; and
removing a subset of the elongated protrusions using the pattern on the second layer.

8. A method comprising:
providing a substrate including a surface with a first layer and a second layer;
forming first, second, and third elongated protrusions in a third layer above the first and second layers;
forming a first patterned layer over the three elongated protrusions;
etching the three elongated protrusions to form a first pattern, the first pattern removing a relatively larger portion of the second elongated protrusion, and relatively smaller portions of the first and third elongated protrusions, whereby an area is formed by the larger and smaller portions;
forming a second patterned layer over the first pattern of elongated protrusions, the second pattern including at least two rectangular sub-patterns over the area separated, at least in part, by a sub-resolution feature; and
etching ends of the first and third elongated protrusions that extend in the area.

9. The method of claim 8, wherein the second patterned layer is a photoresist layer.

10. The method of claim 8 wherein the second pattern layer includes an amorphous silicon hardmask.

11. The method of claim 8 wherein the plurality of elongated protrusions extend in a first direction, and the second pattern layer is configured to make end cuts on the plurality of elongated protrusions in a direction perpendicular to the first direction.

12. The method of claim 8 wherein the second pattern includes three separate rectangular sub-patterns over the area.

13. The method of claim 8 wherein the first layer includes silicon, the second layer includes silicon dioxide, and the elongated protrusions include silicon nitride.

14. The method of claim 13, where the silicon nitride elongated protrusions in the second pattern are fins of the type used for a fin-type field effect transistor.

15. The method of claim 13, wherein etching the plurality of elongated protrusions using the second and third patterned layers forms a pattern of trenches in the layer including silicon dioxide.

16. A method for patterning a plurality of features in a non-rectangular pattern, the method comprising:
providing a substrate including a surface with a first layer and a second layer;
forming first, second, and third elongated protrusions in a third layer above the first and second layers;
etching the three elongated protrusions to form a first pattern, the first pattern removing a relatively larger portion of the second elongated protrusion, and relatively smaller portions of the first and third elongated protrusions, whereby an area is formed by the larger and smaller portions;
forming a second patterned layer over the first pattern of elongated protrusions using an end cutting mask, the end cutting mask including at least two rectangular sub-patterns over the area and a sub-resolution feature therebetween; and
etching ends of the first and third elongated protrusions that extend in the area.

17. The method of claim 16, wherein the end cutting mask is used to produce a patterned photoresist layer over the first pattern of elongated protrusions.

18. The method of claim 16 wherein the end cutting mask includes an amorphous silicon hardmask.

19. The method of claim 16 wherein the plurality of elongated protrusions extend in a first direction, and the end cutting mask is configured to make end cuts on the plurality of elongated protrusions in a direction perpendicular to the first direction.

20. The method of claim 16 wherein the end cutting mask includes three separate rectangular sub-patterns over the area.

* * * * *